(12) United States Patent
Sun et al.

(10) Patent No.: US 11,574,439 B2
(45) Date of Patent: *Feb. 7, 2023

(54) SYSTEMS AND METHODS FOR GENERATING THREE DIMENSIONAL GEOMETRY

(71) Applicant: Hover Inc., San Francisco, CA (US)

(72) Inventors: Shaohui Sun, Mountain View, CA (US); Ioannis Pavlidis, Redwood City, CA (US); Adam J. Altman, San Francisco, CA (US)

(73) Assignee: Hover Inc., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/826,092

(22) Filed: May 26, 2022

(65) Prior Publication Data
US 2022/0284675 A1    Sep. 8, 2022

Related U.S. Application Data

(63) Continuation of application No. 17/396,255, filed on Aug. 6, 2021, which is a continuation of application
(Continued)

(51) Int. Cl.
*G06T 17/00* (2006.01)
*G06T 19/20* (2011.01)
(Continued)

(52) U.S. Cl.
CPC ............ *G06T 17/00* (2013.01); *G06F 3/14* (2013.01); *G06F 30/13* (2020.01); *G06F 30/23* (2020.01);
(Continued)

(58) Field of Classification Search
None
See application file for complete search history.

(56) References Cited

U.S. PATENT DOCUMENTS

| 4,798,028 | A | 1/1989 | Pinion |
| 5,973,697 | A | 10/1999 | Berry et al. |

(Continued)

FOREIGN PATENT DOCUMENTS

| DE | 102016215840 A1 | 3/2018 |
| WO | 2007147830 A1 | 12/2007 |

(Continued)

OTHER PUBLICATIONS

Abdul Hasanulhakeem; A tool to measure dimensions of buildings in various scales for Google Earth Plug-ins and 3D maps; Aug. 6, 2010; pp. 1-2 downloaded from internet: [https://groups.google.com/forum/#topic/google-earth-Drowser-plugin/frlvZQ-m38I].
(Continued)

*Primary Examiner* — Kent W Chang
*Assistant Examiner* — Jonathan M Cofino

(57) ABSTRACT

Systems and methods are described for creating three dimensional models of building objects by creating a point cloud from a plurality of input images, defining edges of the building object's surfaces represented by the point cloud, creating simplified geometries of the building object's surfaces and constructing a building model based on the simplified geometries. Input images may include ground, orthographic, or oblique images. The resultant model may be scaled according to correlation with select image types and textured.

7 Claims, 12 Drawing Sheets

Related U.S. Application Data

No. 16/990,453, filed on Aug. 11, 2020, now Pat. No. 11,113,877, which is a continuation of application No. 15/255,807, filed on Sep. 2, 2016, now Pat. No. 10,776,999, which is a continuation of application No. 14/339,127, filed on Jul. 23, 2014, now Pat. No. 9,437,033.

(60) Provisional application No. 61/857,302, filed on Jul. 23, 2013.

(51) Int. Cl.
| | | |
|---|---|---|
| *G06T 17/05* | (2011.01) | |
| *G06T 15/04* | (2011.01) | |
| *G06V 20/10* | (2022.01) | |
| *G06V 20/64* | (2022.01) | |
| *G06F 30/13* | (2020.01) | |
| *G06T 15/20* | (2011.01) | |
| *G06T 19/00* | (2011.01) | |
| *G06F 30/23* | (2020.01) | |
| *G06F 3/14* | (2006.01) | |

(52) U.S. Cl.
CPC ............ *G06T 15/04* (2013.01); *G06T 15/20* (2013.01); *G06T 17/05* (2013.01); *G06T 19/003* (2013.01); *G06T 19/20* (2013.01); *G06V 20/176* (2022.01); *G06V 20/653* (2022.01); *G06T 2200/08* (2013.01); *G06T 2200/24* (2013.01); *G06T 2207/10028* (2013.01); *G06T 2210/04* (2013.01); *G06T 2210/56* (2013.01); *G06T 2219/004* (2013.01); *G06T 2219/2008* (2013.01); *G06T 2219/2016* (2013.01)

(56) References Cited

U.S. PATENT DOCUMENTS

| | | | |
|---|---|---|---|
| 7,218,318 | B2 | 5/2007 | Shimazu |
| 7,728,833 | B2 | 6/2010 | Verma |
| 7,814,436 | B2 | 10/2010 | Schrag et al. |
| 8,040,343 | B2 | 10/2011 | Kikuchi et al. |
| 8,098,899 | B2 | 1/2012 | Ohashi |
| 8,139,111 | B2 | 3/2012 | Oldroyd |
| 8,339,394 | B1 | 12/2012 | Lininger |
| 8,350,850 | B2 | 1/2013 | Steedly et al. |
| 8,390,617 | B1 | 3/2013 | Reinhardt |
| 8,466,915 | B1 | 6/2013 | Frueh |
| 8,970,579 | B2 | 3/2015 | Muller et al. |
| 9,098,926 | B2 | 8/2015 | Quan et al. |
| 9,129,432 | B2 | 9/2015 | Quan et al. |
| 9,478,031 | B2 | 10/2016 | Bhatawadekar et al. |
| 2003/0014224 | A1 | 1/2003 | Guo et al. |
| 2003/0048928 | A1 | 3/2003 | Yavitz |
| 2003/0052896 | A1 | 3/2003 | Higgins et al. |
| 2004/0196282 | A1 | 10/2004 | Oh |
| 2004/0223662 | A1 | 11/2004 | Urano et al. |
| 2005/0267657 | A1 | 12/2005 | Devdhar |
| 2006/0037279 | A1 | 2/2006 | Onchuck |
| 2007/0104348 | A1 | 5/2007 | Cohen |
| 2007/0168153 | A1 | 7/2007 | Minor et al. |
| 2007/0237420 | A1 | 10/2007 | Steedly et al. |
| 2008/0112610 | A1 | 5/2008 | Israelsen et al. |
| 2008/0221843 | A1 | 9/2008 | Shenkar et al. |
| 2009/0000031 | A1 | 1/2009 | Feher |
| 2009/0010548 | A1 | 1/2009 | Abernethy et al. |
| 2009/0043504 | A1 | 2/2009 | Bandyopadhyay et al. |
| 2009/0132436 | A1 | 5/2009 | Pershing et al. |
| 2009/0153549 | A1 | 6/2009 | Lynch et al. |
| 2010/0045869 | A1 | 2/2010 | Baseley et al. |
| 2010/0074532 | A1 | 3/2010 | Gordon et al. |
| 2010/0110074 | A1 | 5/2010 | Pershing |
| 2010/0114537 | A1 | 5/2010 | Pershing |
| 2010/0201682 | A1 | 8/2010 | Quan et al. |
| 2010/0214291 | A1 | 8/2010 | Muller et al. |
| 2011/0029897 | A1 | 2/2011 | Russell |
| 2011/0064312 | A1 | 3/2011 | Janky et al. |
| 2011/0164059 | A1 | 7/2011 | Bhosale et al. |
| 2011/0181589 | A1 | 7/2011 | Quan et al. |
| 2011/0182477 | A1 | 7/2011 | Tamrakar et al. |
| 2013/0195362 | A1 | 8/2013 | Janky et al. |
| 2013/0202157 | A1 | 8/2013 | Pershing |
| 2013/0202197 | A1 | 8/2013 | Reeler et al. |
| 2013/0300740 | A1 | 11/2013 | Snyder et al. |
| 2014/0099035 | A1 | 4/2014 | Ciarcia |
| 2014/0212028 | A1 | 7/2014 | Ciarcia |
| 2014/0247325 | A1 | 9/2014 | Wu et al. |
| 2014/0270359 | A1 | 9/2014 | Baker |
| 2015/0156415 | A1 | 6/2015 | Gallup et al. |

FOREIGN PATENT DOCUMENTS

| | | |
|---|---|---|
| WO | 2011079241 A1 | 6/2011 |
| WO | 2011091552 A1 | 8/2011 |

OTHER PUBLICATIONS

Bansal, et al., "Geo-Localization of Street Views with Aerial Image Databases," Nov. 28-Dec. 1, 2011, pp. 1125-1128.

Becker, et al., "Semiautomatic 3-D model extraction from uncalibrated 2-D camera views," MIT Media Laboratory, Feb. 8-10, 1995, 15 pages.

Chen, et al., "City-Scale Landmark Identification on Mobile Devices," Jun. 20-25, 2011, pp. 737-744.

Fairfax County Virginia, "Virtual Fairfax," http://www.fairfaxcounty.gov/gis/virtualfairfax, Feb. 24, 2014, 2 pages.

Fruh and Zakhor, "Constructing 3D City Models by Merging Aerial and Ground Views," IEEE Computer Graphics and Applications, Nov./Dec. 2003, pp. 52-61, 10 pages.

Huang and Wu, et al., "Towards 3D City Modeling through Combining Ground Level Panoramic and Orthogonal Aerial Imagery," 2011 Workshop on Digital Media and Digital Content Management, pp. 66-71, 6 pages.

Jaynes, "View Alignment of Aerial and Terrestrial Imagery in Urban Environments," Springer-Verlag Berlin Heidelber1 1999, pp. 3-19, 17 pages.

Kroepfl, et al., "Efficiently Locating Photographs in Many Panoramas," Nov. 2-5, 2010, ACM GIS10.

Lee, et al., "Automatic Integration of Facade Textures into 3D Building Models with a Projective Geometry Based Line Clustering," Eurographics 2002, vol. 2, No. 3, 10 pages.

Lee, et al., "Integrating Ground and Aerial Views for Urban Site Modeling," 2002, 6 pages.

Murillo et al., "Visual Door Detection Integrating Appearance and Shape Cues", Dec. 2007, Elsevier, vol. 56, No. 6, pp. 512-521.

Ou et al., "A New Method for Automatic Large Scale Map Updating Using Mobile Mapping imagery," Sep. 2013, Wiley Online Library, vol. 28, No. 143, pp. 240-260.

Xiao, et al., "Image-based Facade Modeling," ACM Transaction on Graphics {TOG), 2008, 10 pages.

Vosselman et al., "3D Building Model Reconstruction From Point Clouds and Ground Plans," Oct. 2001, Natural Resources Canada, vol. 34, No. 3/W4, pp. 37-44.

Wang, et al.; Large-Scale Urban Modeling by Combining Ground Level Panoramic and Aerial Imagery; IEEE Third International Symposium on 3D Data Processing, Visualization, and Transmission; Jun. 14-16, 2006; pp. 806-813.

Korzec et al., "Method for detecting curbs in the vehicle environment", Mar. 1, 2018 (Year: 2018).

US 11,574,439 B2

SYSTEMS AND METHODS FOR GENERATING THREE DIMENSIONAL GEOMETRY

CROSS-REFERENCE TO RELATED APPLICATIONS/INCORPORATION BY REFERENCE

The present U.S. Utility Patent Application claims priority pursuant to 35 U.S.C. § 120 as a continuation of U.S. Utility application Ser. No. 17/396,255, entitled "SYSTEMS AND METHODS FOR GENERATING THREE DIMENSIONAL GEOMETRY," filed on Aug. 6, 2021, which is a continuation of U.S. Utility application Ser. No. 16/990,453, entitled "SYSTEM AND METHOD FOR GENERATING THREE DIMENSIONAL GEOMETRY," filed Aug. 11, 2020, now U.S. Pat. No. 11,113,877, which is a continuation of U.S. Utility application Ser. No. 15/255,807, entitled "GENERATING MULTI-DIMENSIONAL BUILDING MODELS WITH GROUND LEVEL IMAGES," filed Sep. 2, 2016, now U.S. Pat. No. 10,776,999, which is a continuation of U.S. Utility application Ser. No. 14/339,127, entitled "GENERATING 3D BUILDING MODELS WITH GROUND LEVEL AND ORTHOGONAL IMAGES," filed Jul. 23, 2014, now U.S. Pat. No. 9,437,033, which claims priority pursuant to 35 U.S.C. § 119(e) to U.S. Provisional Application No. 61/857,302, entitled "GENERATING 3D BUILDING MODELS WITH STREET-LEVEL AND ORTHOGONAL IMAGES," filed Jul. 23, 2013, all of which are hereby incorporated herein by reference in their entirety and made part of the present U.S. Utility Patent Application for all purposes.

The present Application is related to the following:

1. U.S. Utility application Ser. No. 13/624,816, entitled, "THREE-DIMENSIONAL MAP SYSTEM," filed on Sep. 21, 2012, now U.S. Pat. No. 8,878,865 and 2. U.S. Utility application Ser. No. 12/265,656, entitled "METHOD AND SYSTEM FOR GEOMETRY EXTRACTION, 3D VISUALIZATION AND ANALYSIS USING ARBITRARY OBLIQUE IMAGERY," filed Nov. 5, 2008, now U.S. Pat. No. 8,422,825.

Both applications are hereby incorporated herein by reference in their entirety and made part of the present Application for all purposes.

BACKGROUND

Technical Field

The technology described herein relates generally to a system and method for generating accurate 3D building models, and in particular to a system and method for constructing, texturing and retexturing of 3D building models.

Location-based technologies and mobile technologies are often considered the center of the technology revolution of this century. Essential to these technologies is a way to best present location-based information to devices, particularly mobile devices. The technology used to represent this information has traditionally been based on a two-dimensional (2D) map.

Some efforts have been made to generate three-dimensional (3D) maps of urban cities with accurate 3D textured models of the buildings via aerial imagery or specialized camera-equipped vehicles. However, these 3D maps have limited texture resolution and geometry quality, are expensive, time consuming and difficult to update and provide no robust real-time image data analytics for various consumer and commercial use cases.

DETAILED DESCRIPTION

In various embodiments of the technology described herein, a system and method is provided for creating and texturing a 3D building model using ground-level and orthogonal imagery. The 3D building model is representative of a physical building in the real-world. In one embodiment, a 3D building model generation system is provided that textures a 3D building model corresponding to a plurality uploaded images. An uploaded image is, for example, a photograph of a physical building. In other embodiments, the uploaded image includes a façade (side) of the physical building.

Figure 1:
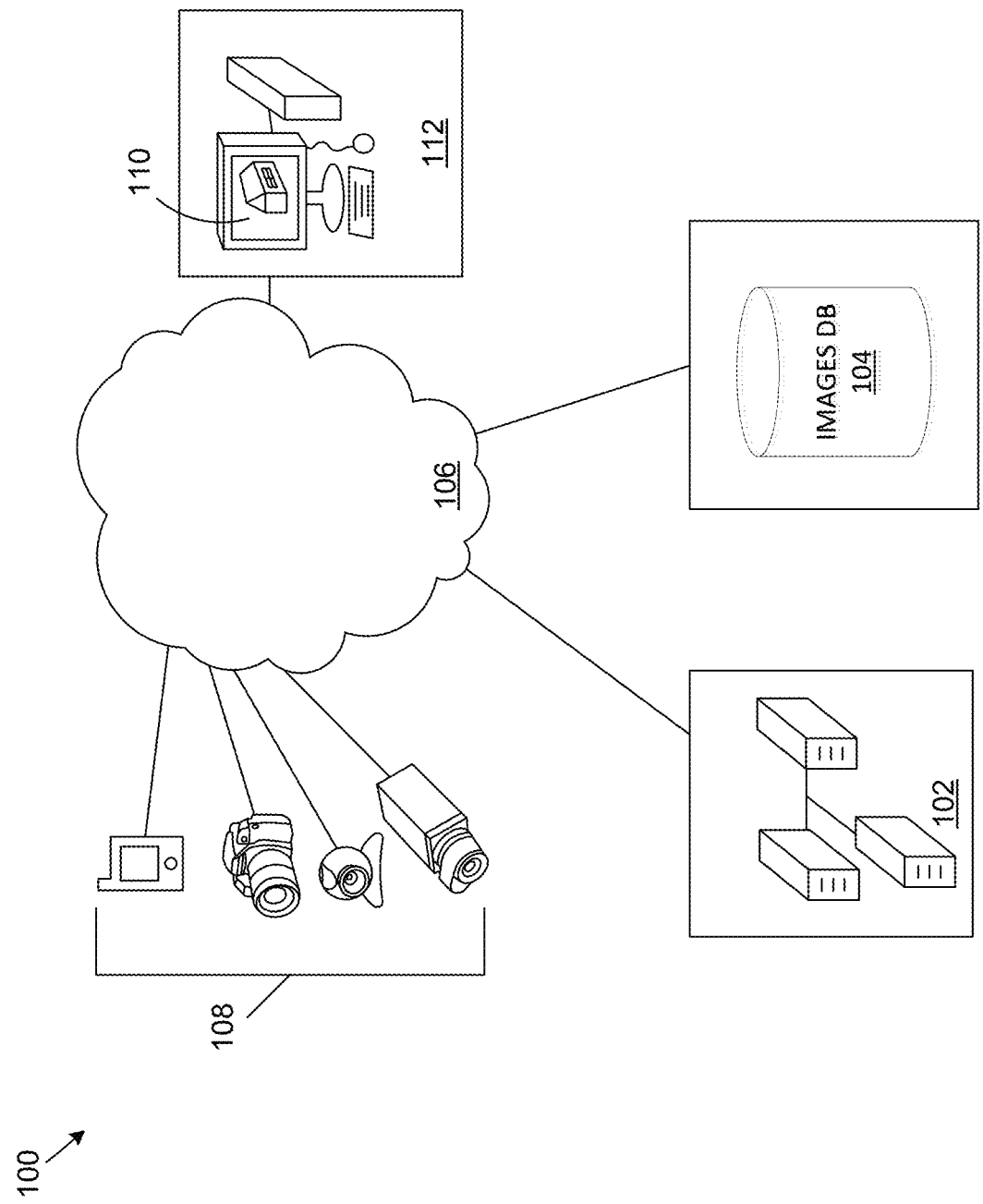
FIG. 1 illustrates one embodiment of a system architecture in accordance with the present disclosure.

FIG. 1 illustrates one embodiment of system architecture in accordance with the present disclosure. In one embodiment, 3D building model generation system 100 includes image processing system 102 and image database 104. In other embodiments, orthogonal image database 104 and the image processing system 102 is coupled via a network channel 106. The image processing system 102 is a computer system for processing images in preparation for mapping the images to a 3D environment, for example, the computer system of FIG. 12.

Network channel 106 is a system for communication. Network channel 106 includes, for example, an Ethernet or other wire-based network or a wireless NIC (WNIC) or wireless adapter for communicating with a wireless network, such as a WI-FI network. In other embodiments, network channel 106 includes any suitable network for any suitable communication interface. As an example and not by way of limitation, network channel 106 can include an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As another example, network channel 106 can be a wireless PAN (WPAN) (such as, for example, a BLU-ETOOTH WPAN), a WI-FI network, a WI-MAX network, a 3G or 4G network, a cellular telephone network (such as, for example, a Global System for Mobile Communications (GSM) network).

In one embodiment, network channel 106 uses standard communications technologies and/or protocols. Thus, network channel 106 can include links using technologies such as Ethernet, 802.11, worldwide interoperability for microwave access (WiMAX), 3G, 4G, CDMA, digital subscriber line (DSL), etc. Similarly, the networking protocols used on network channel 106 can include multiprotocol label switching (MPLS), the transmission control protocol/Internet protocol (TCP/IP), the User Datagram Protocol (UDP), the hypertext transport protocol (HTTP), the simple mail transfer protocol (SMTP), and the file transfer protocol (FTP). In one embodiment, the data exchanged over network channel 106 is represented using technologies and/or formats including the hypertext markup language (HTML) and the extensible markup language (XML). In addition, all or some of links can be encrypted using conventional encryption technologies such as secure sockets layer (SSL), transport layer security (TLS), and Internet Protocol security (IPsec).

In another embodiment, image processing system 102 processes the images collected and maps them to a specific building. In yet another embodiment, the image is also mapped on a particular surface or region of the building. Capture device(s) 108 is in communication with image processing system 102 for collecting images of building objects. Capture devices 108 are defined as electronic devices for capturing images. For example, the capture devices includes a camera, a phone, a smartphone, a tablet, a video camera, a security camera, a closed-circuit television camera, a computer, a laptop, a webcam, wearable camera devices, photosensitive sensors, or any combination thereof.

Three-dimensional building model system 100 also provides for viewer device 112 that is defined as a display device. For example, viewer device 112 can be a computer with a monitor, a laptop, a touch screen display, a LED array, a television set, a projector display, a wearable heads-up display of some sort, or any combination thereof. In one embodiment, viewer device 112 includes a computer system, such as computer system 1100 of FIG. 12, for processing a 3D environment 110 for display.

Figure 2:
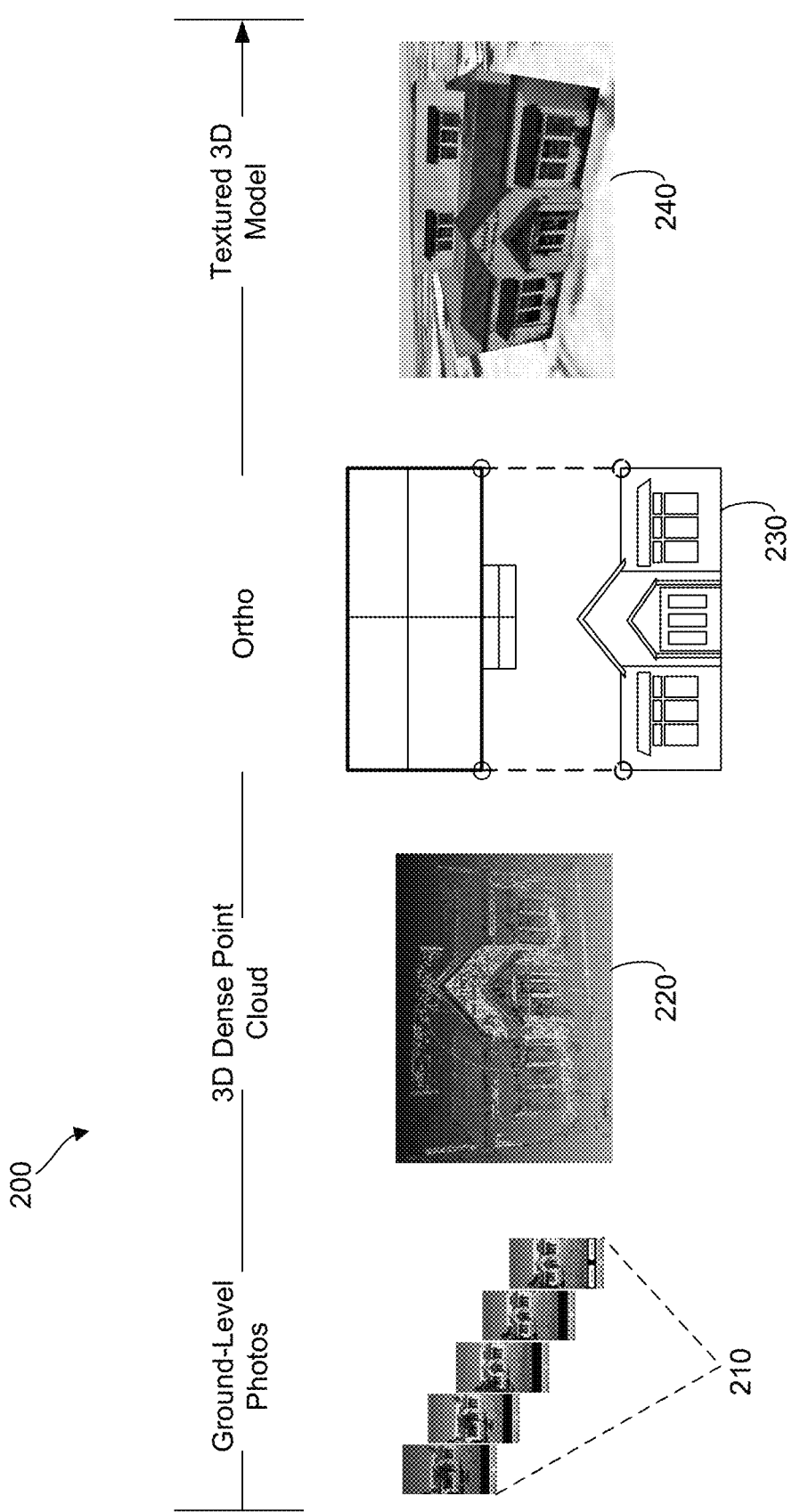
FIG. 2 illustrates a graphical overview of the general process for accurately creating and texturing a 3D building model in accordance with the present disclosure.

FIG. 2 illustrates a graphical overview of the general process for accurately creating and texturing a 3D building model in accordance with the present disclosure. Process 200 includes collecting a plurality of ground-level images 210 of a façade (or a plurality of façades) of a building, generating a 3D dense point cloud 220, processing the 3D dense point cloud to include use of orthogonal (ortho) images 230, and outputting a textured 3D building model 240. A third type of information that is available to the system is oblique imaging. Oblique imagery includes images taken at an angle other than the vertical perspective or images derived from vertical imagery that provide perspective after processing. Oblique images provide a perspective line of sight that reveals information that is not visible in an orthophoto view. For example, an oblique image has an angle to the target between zero and eighty-nine degrees. Oblique images can be captured by aerial photography or imaging systems, satellite imagery, aerial sensor systems, ground based imaging systems, video or video capture technology and similar systems.

Figure 3:
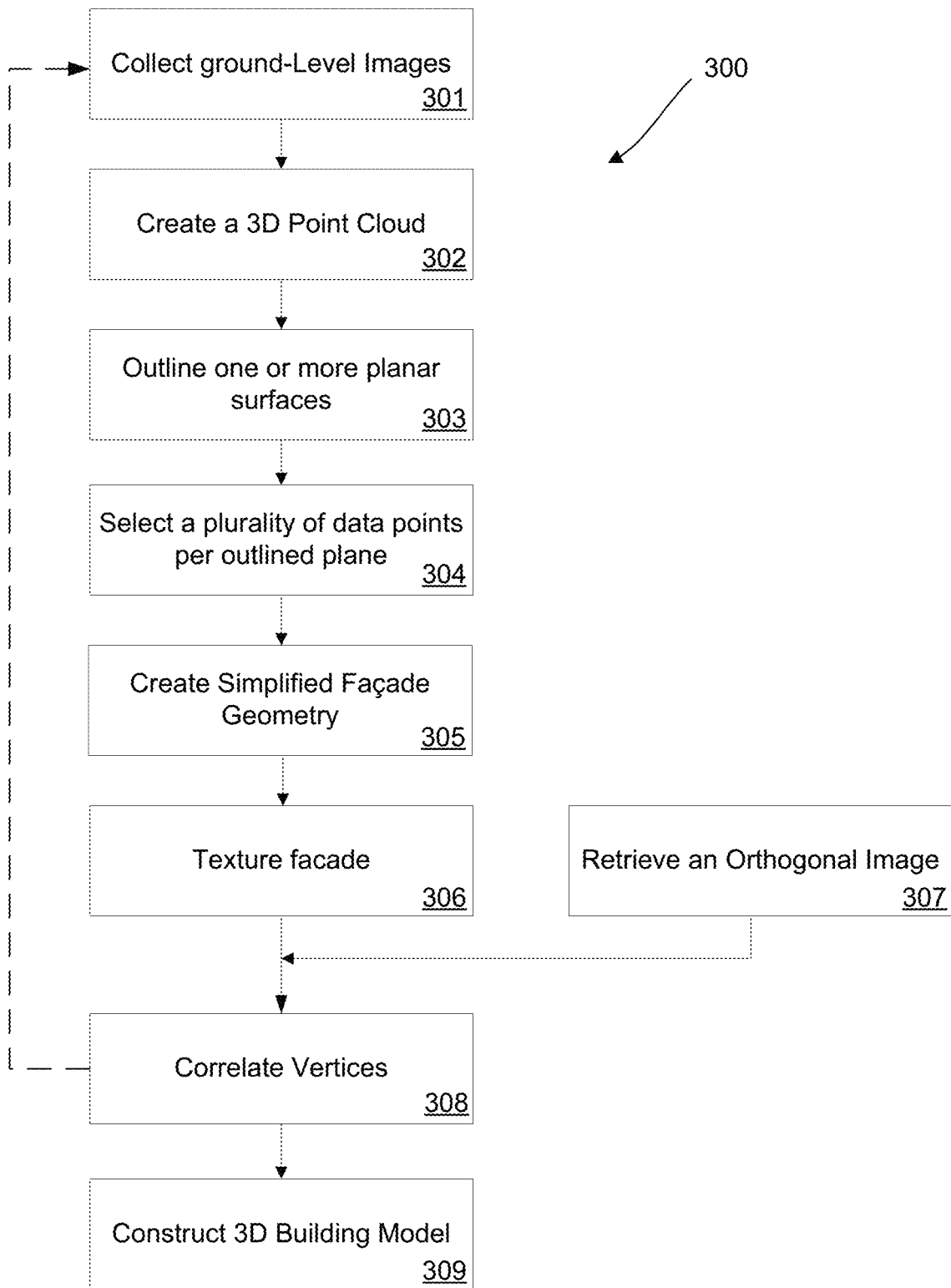
FIG. 3 illustrates a flowchart representing the process for accurately creating and texturing a 3D building model in accordance with the present disclosure.

FIG. 3 illustrates a flowchart representing the process for creating and accurately texturing a 3D building model in accordance with the present disclosure. Process 300 begins with a collection of a plurality of ground-level images of at least one side of a building object (e.g., the façade of a building object) in step 301. In one embodiment, images are captured as the picture taker moves around the building— taking a plurality (e.g., 8-16 for an entire building) of images from multiple angles and distances. In one embodiment, ground-level images are uploaded from a capture device such as a smartphone. In some embodiments, the capture devices directly upload images to image processing system 102 via a network channel as illustrated in FIG. 1. In another embodiment, images are indirectly uploaded to image processing system 102 of FIG. 1. For example, the images are uploaded to a computer or a server from third party image services (e.g. Flickr, Facebook, Twitter, etc.) first before being uploaded to image processing system 102. For another example, the images are transferred from a camera first to a networked computer, and then the images are transferred to image processing system 102.

Referring again to FIG. 3, in step 302, a 3D dense point cloud of the building object is created from the plurality of collected ground-level images. A point cloud is a set of data points in a coordinate system. In the three-dimensional coordinate system of the technology described herein, these points are defined by X, Y, and Z coordinates, and are intended to represent the external surface of an object. In one embodiment, key architectural geometric features of the 3D dense point cloud are identified. Architectural features include, but are not limited to: roof intersection vertices, ground intersection vertices, bay window vertices, overhanging vertices. In alternative embodiments, the identification of architectural geometric features is performed manually by a reviewer or semi-automatically/fully automatically by matching to libraries of known architectural features stored within memory in the system of FIG. 1 or stored remotely and accessible by the system.

In step 303, the boundaries of one or more planar surfaces are outlined by determining the vertices/edges of each planar surface. The vertices/edges of each planar surface can be manually selected or determined using known image processing algorithms (described in greater detail in FIG. 8-10 discussion). In step 304, for each outlined planar surface, a plurality of data points (e.g., 3) are selected which are part of a single planar surface and from the set of data points within the 3D dense point cloud. In step 305, repeated correlation of the outlined planes to data points within the 3D dense point cloud creates simplified façade geometry (planar).

With the planar geometry defined, the ground-level images are used to create a textured 3D building model in step 306 using texturing techniques (e.g., wrapping a ground-level or combination of ground-level images around the defined geometry) as described in commonly assigned U.S. Pat. No. 8,422,825 and published US application 2013/0069944 which are hereby incorporated by reference.

In separate step 307, an orthogonal image for the building object is retrieved using an address, map, or known geo-location (for example from the ground level image camera). The orthogonal image is aligned with a plurality of vertices of at least a common planar surface (as will be described in greater detail in association with FIG. 10). In one embodiment, the correlation of the orthogonal image is used to identify vertices/edges and extract scale, rotation and coordinate information for the entire 3D building model. The vertices/edges from ground-level 3D dense point cloud and the orthogonal image are correlated to create a 3D building model in step 308. In some embodiments, this can also be achieved by recovering the two-dimensional pixel location on a geo-correlated oblique image. The image can be either the orthographic or any of the correlated oblique views.

At the end of steps 301-309, a 3D building model with at least one textured façade is available for additional processing. For example, steps 301-306 and 308 can optionally be repeated for additional façades. The entire building is constructed in step 309 based on the existing information (sets of ground level images per façade, building geometry, façade geometry (textured), scale and geo-position). The roof, in one or more embodiments, is left untextured (e.g., flat), textured using the retrieved ortho imagery and known height of vertices/edges, or is textured using the ortho imagery and known example roof constructs (e.g., flat, central peak, multi-peak, etc.) stored in a table in computer memory.

Figure 4:
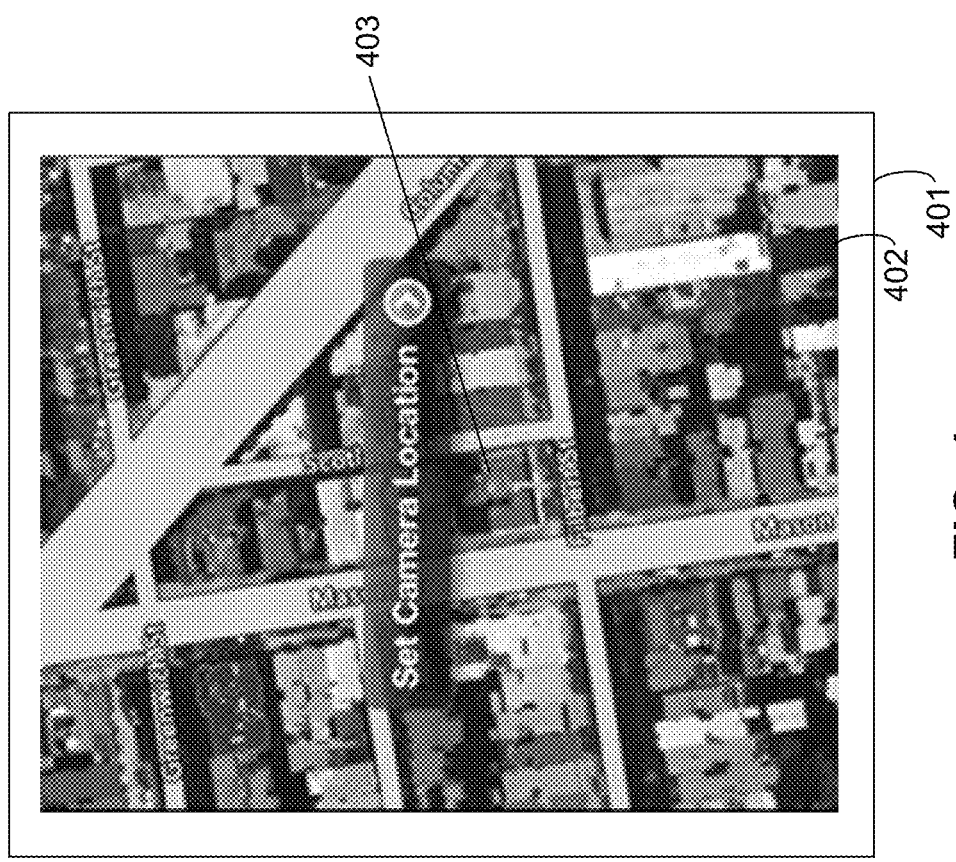
FIG. 4 illustrates a diagram of geo-referencing a building location in accordance with the present disclosure.

FIG. 4 illustrates a diagram of geo-referencing a building location in accordance with the present disclosure. In one embodiment, capture devices include a global positioning system (GPS) for providing location information. The capture device is used to identify a location using the GPS information of a current location. As shown in FIG. 4, the capture device displays map 402 showing its current location 403. In one embodiment, confirmation of the GPS determined location information is required. In an alternative embodiment, the capture device provides camera orientation information (e.g., direction, angle, etc.). In yet another alternative embodiment, the location of a building is determined by manually typing in an address or selecting a specific building image or point on a map.

Figure 5:
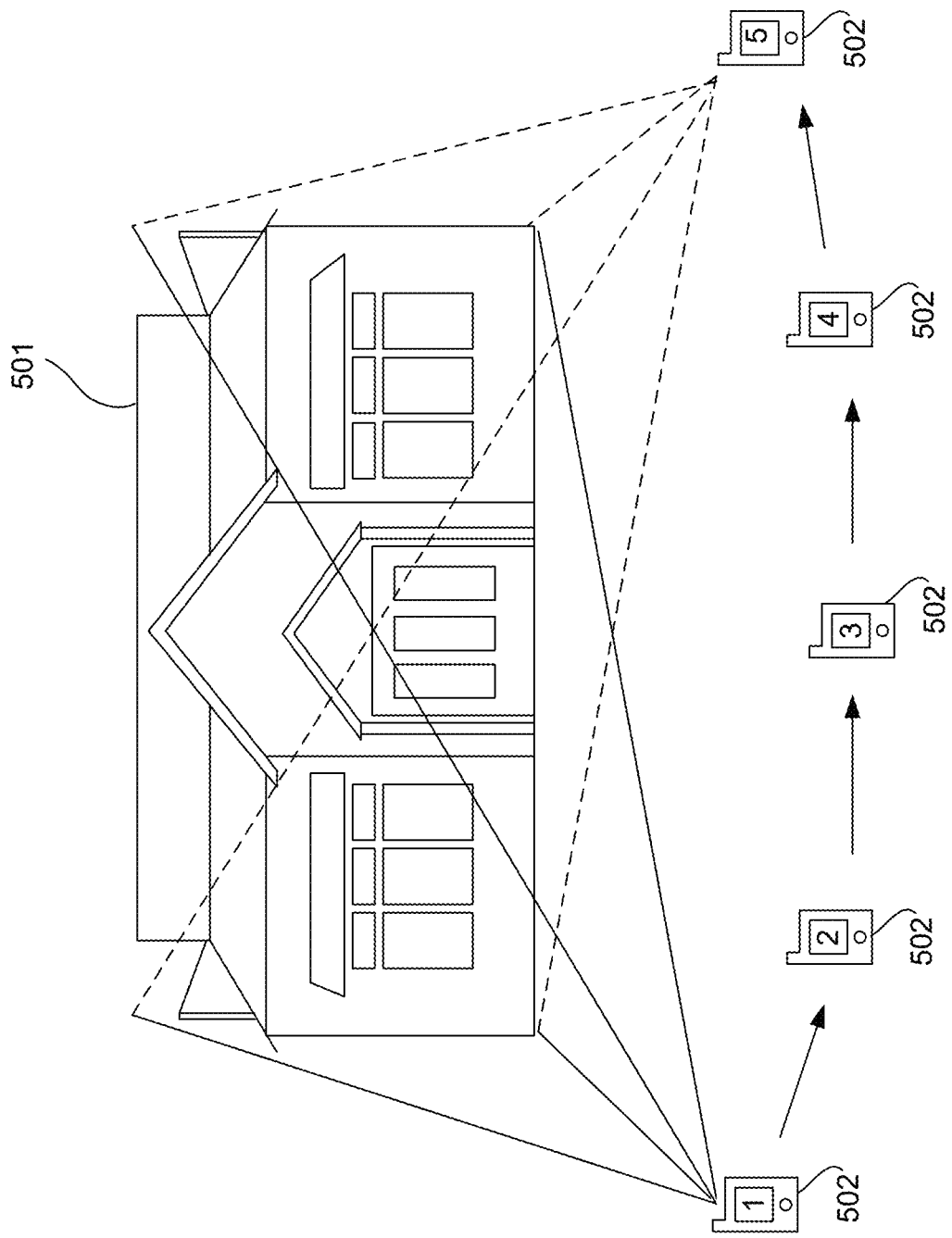
FIG. 5 illustrates a diagram of capturing ground-level images of a building object in accordance with the present disclosure.

FIG. 5 illustrates a diagram of capturing ground-level images of a building object in accordance with the present disclosure. A plurality of ground-level images for a façade of building object 501 are collected by capture device 502. Each ground-level image is taken at a different perspective relative to the other images of the façade. For example, capture device 502 collects five ground-level images moving from left-to-right at a first position, a second position, a third position, a fourth position and a fifth position. For optimal dense point cloud generation, each of the images encompasses the entire perimeter of the building (left-to-right, top-to-bottom). The number of ground-level images, order taken, and orientation, may be modified without departing from the spirit of the technology described herein. However, 3D point cloud densities generally will increase with the number, quality, and breadth (capturing many angles) of images used to build the 3D dense point cloud.

Figure 6:
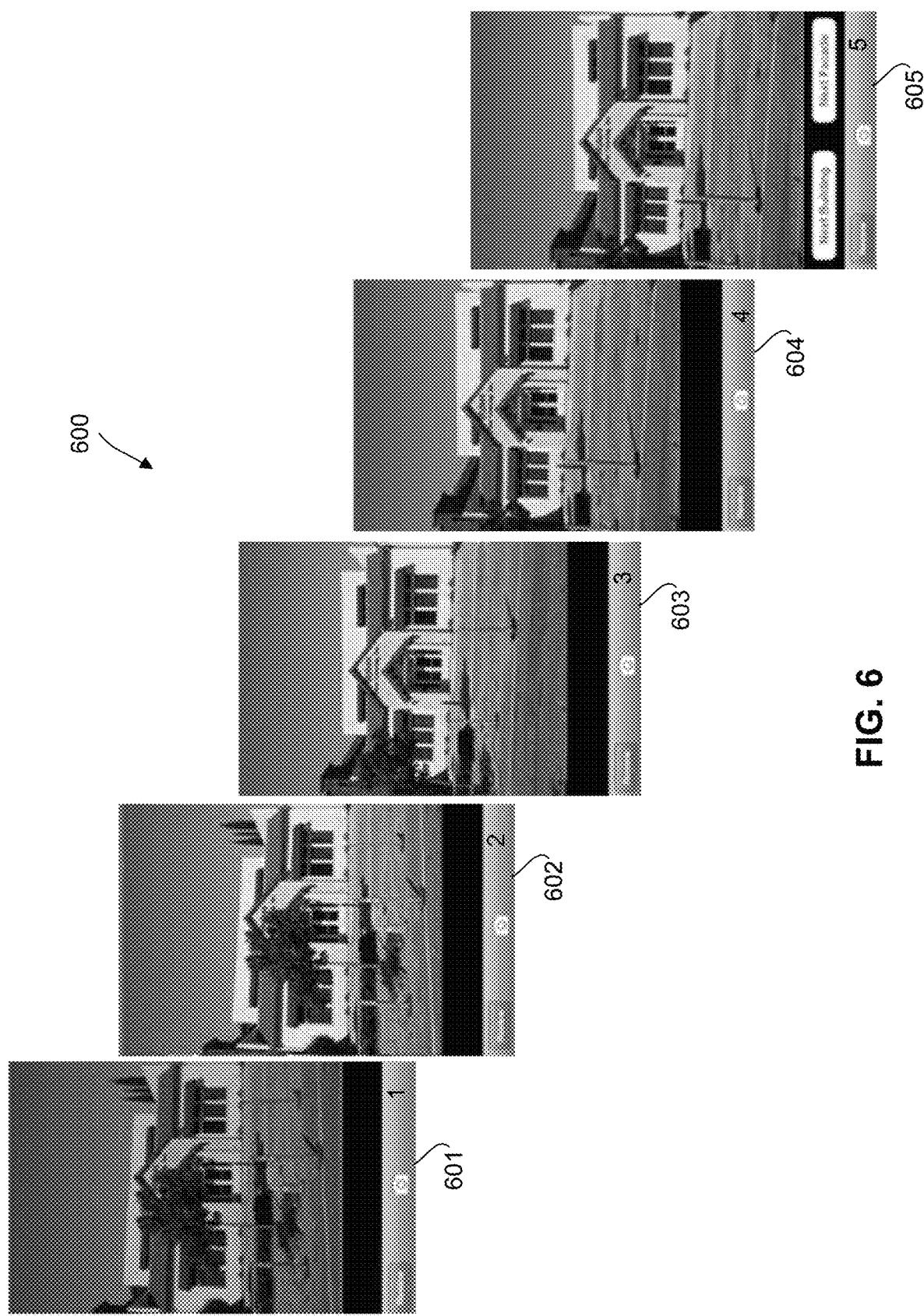
FIG. 6 illustrates an example of collected ground-level images for the façade of a building in accordance with the present disclosure.

FIG. 6 illustrates an example of collected ground-level images for the façade of a building in accordance with the present disclosure. Ground-level images 600 provide for different perspectives of the building façade. Ground-level images 601 to 605 capture the building from five perspectives panning the entire façade of the building. Ground-level image 601 provides for the left most building façade perspective relative to the other ground-level images. Ground-level image 605 provides for the right most building façade perspective relative to the other ground-level images. Ground-level images 602 through 604 represent the building façade from three additional perspectives between ground-level images 601 and 605. Ground-level images 600 are collected from the various perspectives, uploaded to system 100 used to generate the 3D dense point cloud representing the façade of the building.

As previously described, the plurality of ground-level images include the boundaries of the building façade. For example, a plurality of ground-level images is captured for a building object and includes an image from the perspective defining the far left edge of the façade and an image from the perspective defining the far right edge of the façade. Including the boundaries of the façade in the plurality of ground-level images helps define vertices/edges within the 3D dense point clouds created by the plurality of ground-level images. In alternative embodiments, the plurality of ground-level images captured for the building object are not required to include the boundaries of the façade in order generate the 3D dense point cloud. In yet another embodiment, multiple facades are captured in a single image which includes the boundary vertices (corner).

In yet another embodiment, a plurality of ground-level images are collected for each side and/or corner of the building (the first side of the building, typically the front façade of the building). For example, when a building is part of a larger collection of buildings (i.e., a townhome, a store in a strip mall, etc.) not all sides of the building are accessible for ground-level images as at least one side is shared with an adjacent building. For stand-alone building objects, a plurality of ground-level images is collected for each side and/or corner of the building object. For example, a single family home generally has 4 facades (i.e., first side (front façade), back side and left/right sides) and a plurality of ground-level images collected for each side and/or corner would result in a 3D building model of the single family home having each side accurately textured.

Figure 7:
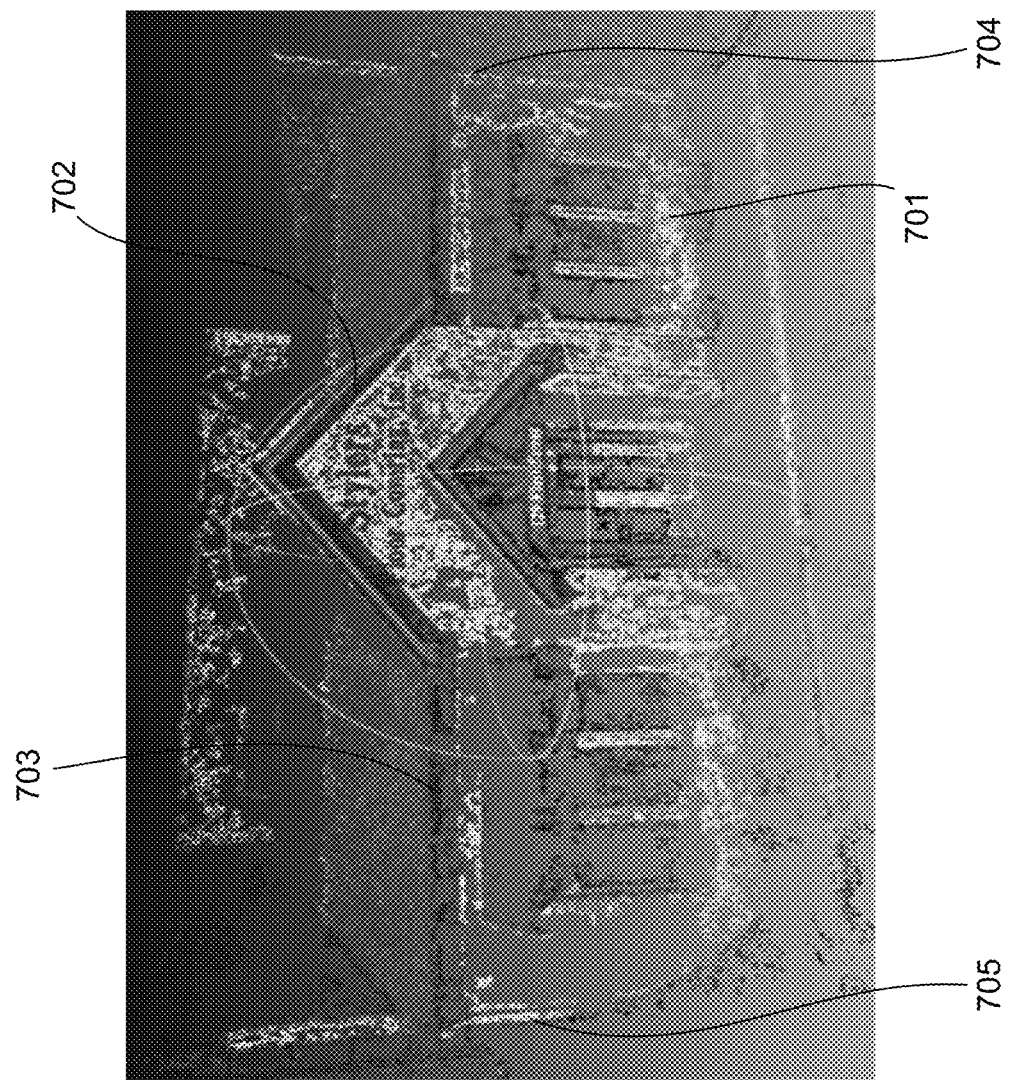
FIG. 7 illustrates a 3D dense point cloud of a building façade generated in accordance with the present disclosure.

FIG. 7 illustrates a 3D dense point cloud of a building façade generated in accordance with the present disclosure. The plurality of ground-level images collected for the building façade (FIG. 6) is used to extrapolate a dense 3D point cloud of the building object. In the example embodiment, five ground-level images of the façade were used to generate an accurate 3D dense point cloud representative of that building façade. In another example embodiment, multiple sets of five ground-level images, one for each side, are used to generate an accurate 3D point cloud representative of the entire building object. The stereo-view of the building created by a plurality of ground-level images collected from the different perspectives allows for a 3D dense point cloud to depict architectural features of the corresponding building façade. For example, 3D dense point cloud 701 was generated using a plurality of ground-level images of the façade of the building captured from different perspectives. 3D dense point cloud 701 provides for potential identification of architectural features such as roof intersections 702 and 703 with the facade and wall edges 704 and 705.

Figure 8:
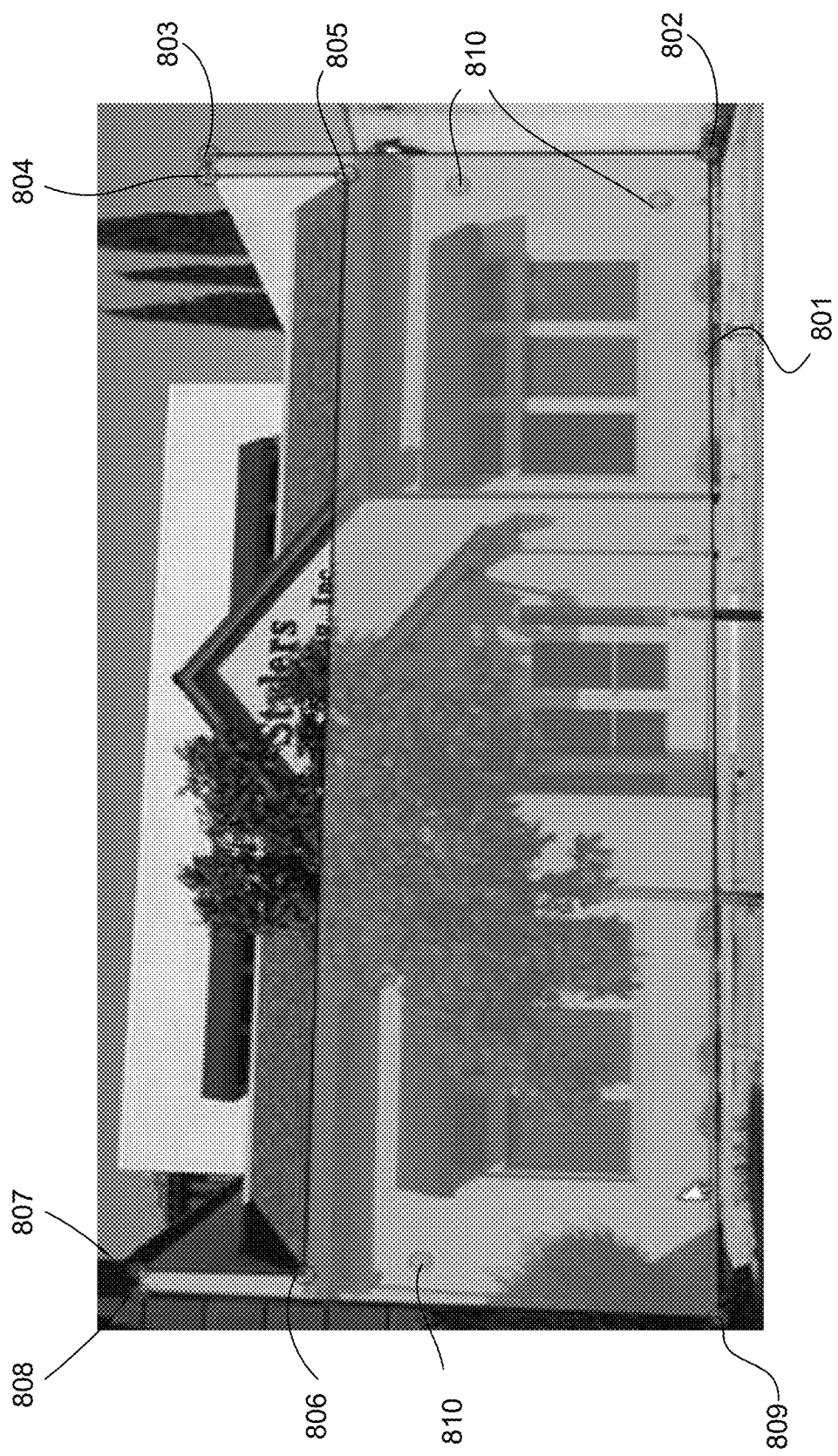
FIG. 8 illustrates an aspect embodiment for establishing planes in a 3D dense point cloud in accordance with the present disclosure.

FIG. 8 illustrates an aspect embodiment for establishing planes (e.g., large planes) for a 3D dense point cloud in accordance with the present disclosure. In one embodiment, 3D dense point cloud 701 (FIG. 7) provides for distinguishing planes of the building façade. For example, a roof plane is distinguishable from a façade plane and parallel planes are distinguishable from one another. The planar surface is first defined (outlined) by selecting a plurality of vertices of a selected planar surface from at least one of the plurality of ground-level images (FIG. 6). The planar surface is defined by selecting vertices 802, 803, 804, 805, 806, 807, 808 and 809 thus defining large plane 801 of the image. In a next process, described in more detail with respect to FIG. 9, a plurality of data points 810 are selected from the outlined plane to link the outlined plane to the 3D dense point cloud.

Figure 9:
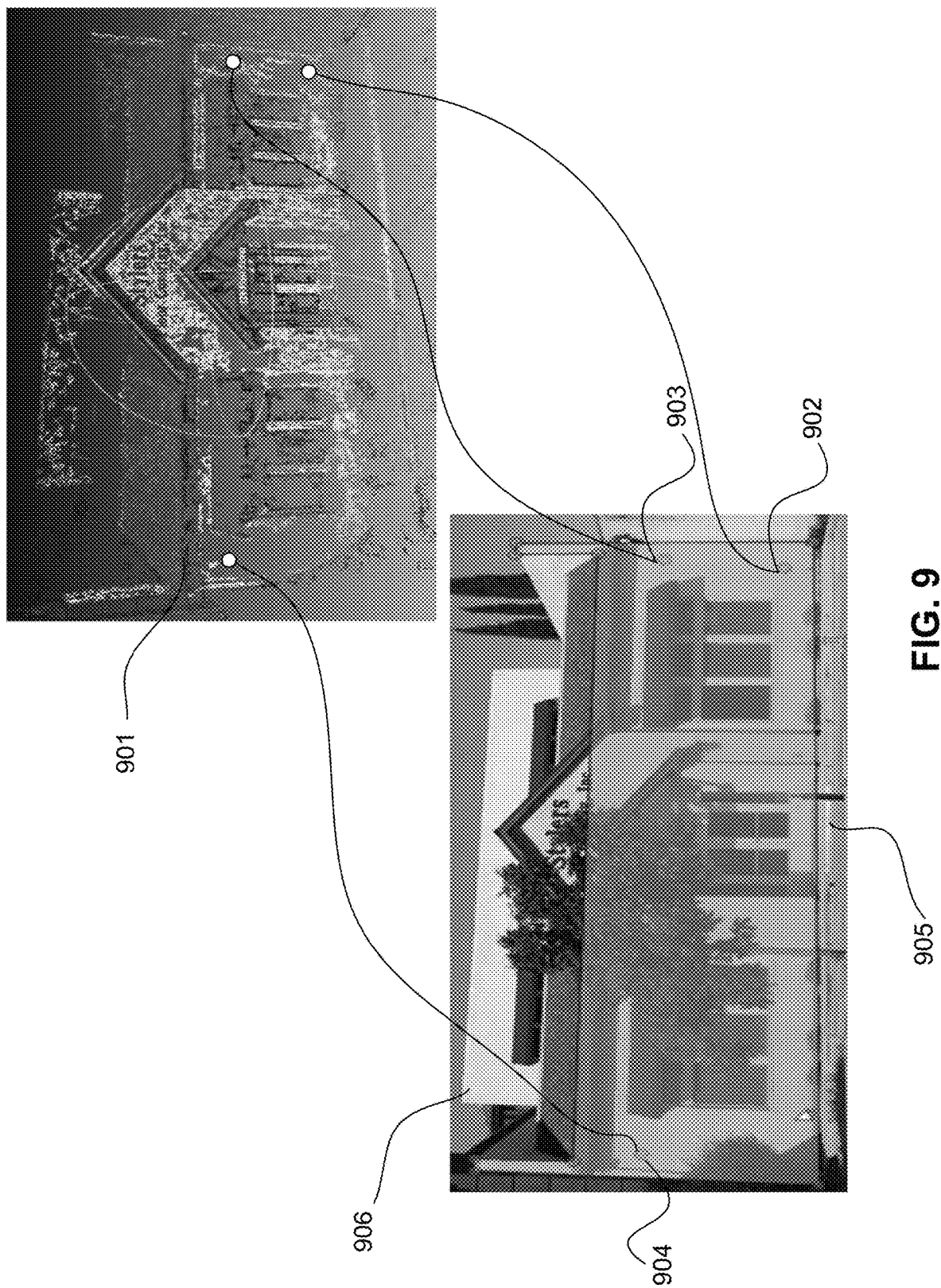
FIG. 9 illustrates an aspect embodiment for correlating selected planes to a 3D dense point cloud in accordance with the present disclosure.

FIG. 9 illustrates an aspect embodiment for correlating selected planes to a 3D dense point cloud in accordance with the present disclosure. As previously discussed, 3D point cloud (901) includes data points generated from a plurality of ground-level images collected from different perspectives of the capture device relative to the façade of the building. To link the outlined planes as described with respect to FIG. 8, a plurality (e.g., 3) of data points 902, 903 and 904 are selected following the plane outline steps and correlated to data points in 3D dense point cloud 901 to determine planar surface 905 of building 906. The selected data points should correspond to a single plane of building 906. In various embodiments, the selection of the plurality of data points is performed manually, semi-automatically or fully automatically.

In one embodiment, a 3D proximity buffer is applied to the selected data points to determine the planar surface and identify those data points in the 3D dense point cloud that are in close proximity to a region around each of the selected data points. For example, when selecting a data point to correlate an outlined plane to the 3D dense point cloud, the closest actual 3D dense point cloud data point to the selected region is used as the data point to determine the planar surface. The data points are averaged to find an average planar fit and determine the planar surface and the 3D building plane position alignment is adjusted. In another embodiment, random sample consensus (RANSAC) is used to determine the 3D proximity buffer that is applied to the data points for the determination of the planar surface. Once planes are correlated, the façade is textured by applying one or more of the ground-level images to the defined geometry (i.e., planes).

Figure 10:
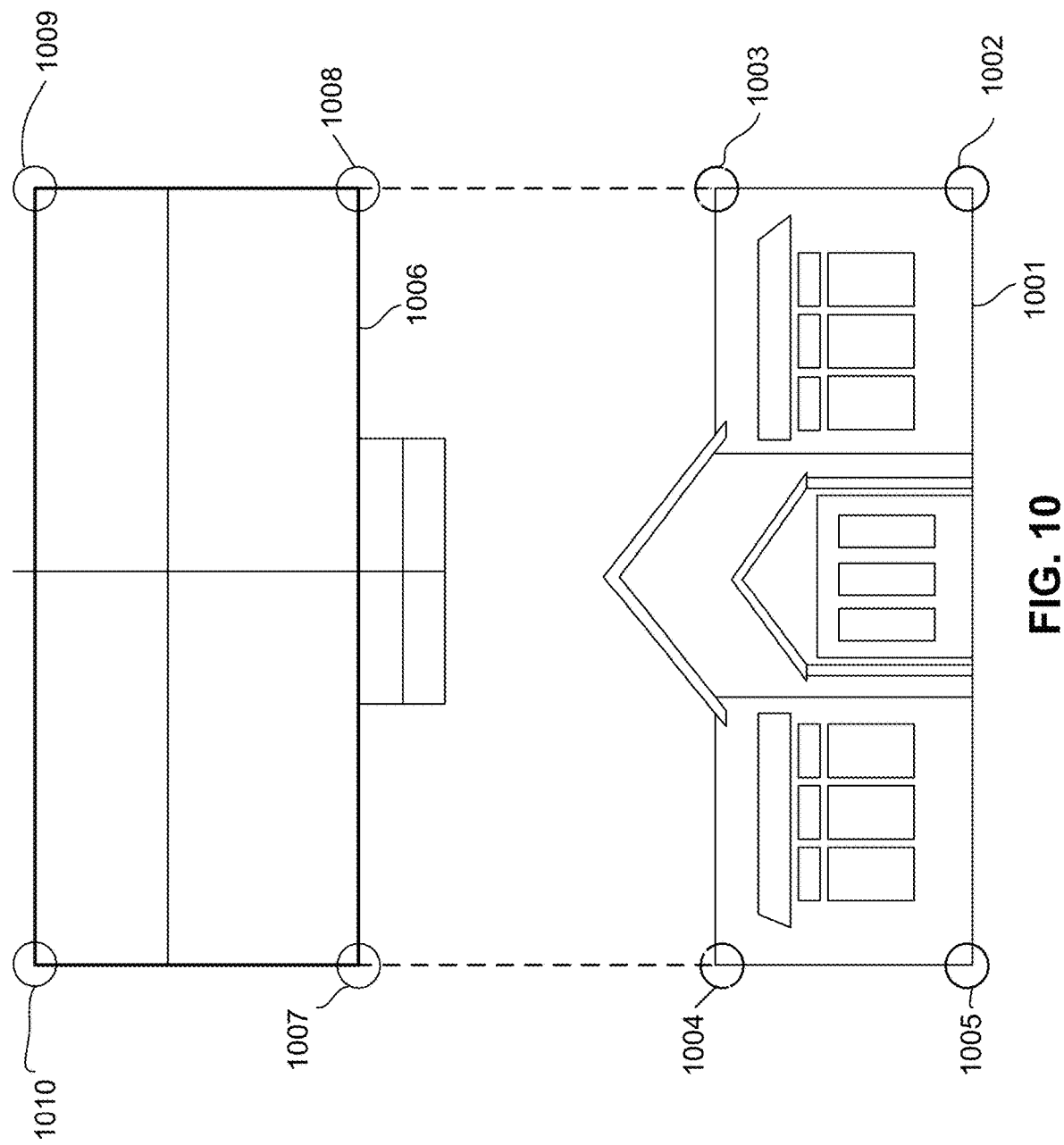
FIG. 10 illustrates an embodiment of the process for creation of the 3D model, scaling and rotating in accordance with the present disclosure.

FIG. 10 illustrates an embodiment of the process for creation of the 3D model, scaling and rotating in accordance with the present disclosure. Once a single textured façade (representing any side) has been created, an orthogonal image (from overhead) is used to complete the 3D model, provide scale (size) and proper rotation of the 3D model. In one embodiment, rooftop lines of a corresponding building object within an orthogonal image (as selected by address, from a map or geo-referenced data, etc.) are determined by identifying vertices/edges. Orthogonal images and inherent building geometry vertices/edge for building objects provide a more accurate scale (as the scale in the ortho image is known (e.g. 6 inches per pixel)). In addition, proper rotation and location information can be determined by correlation of the textured façade with the ortho image of the same building object.

Figure 11:
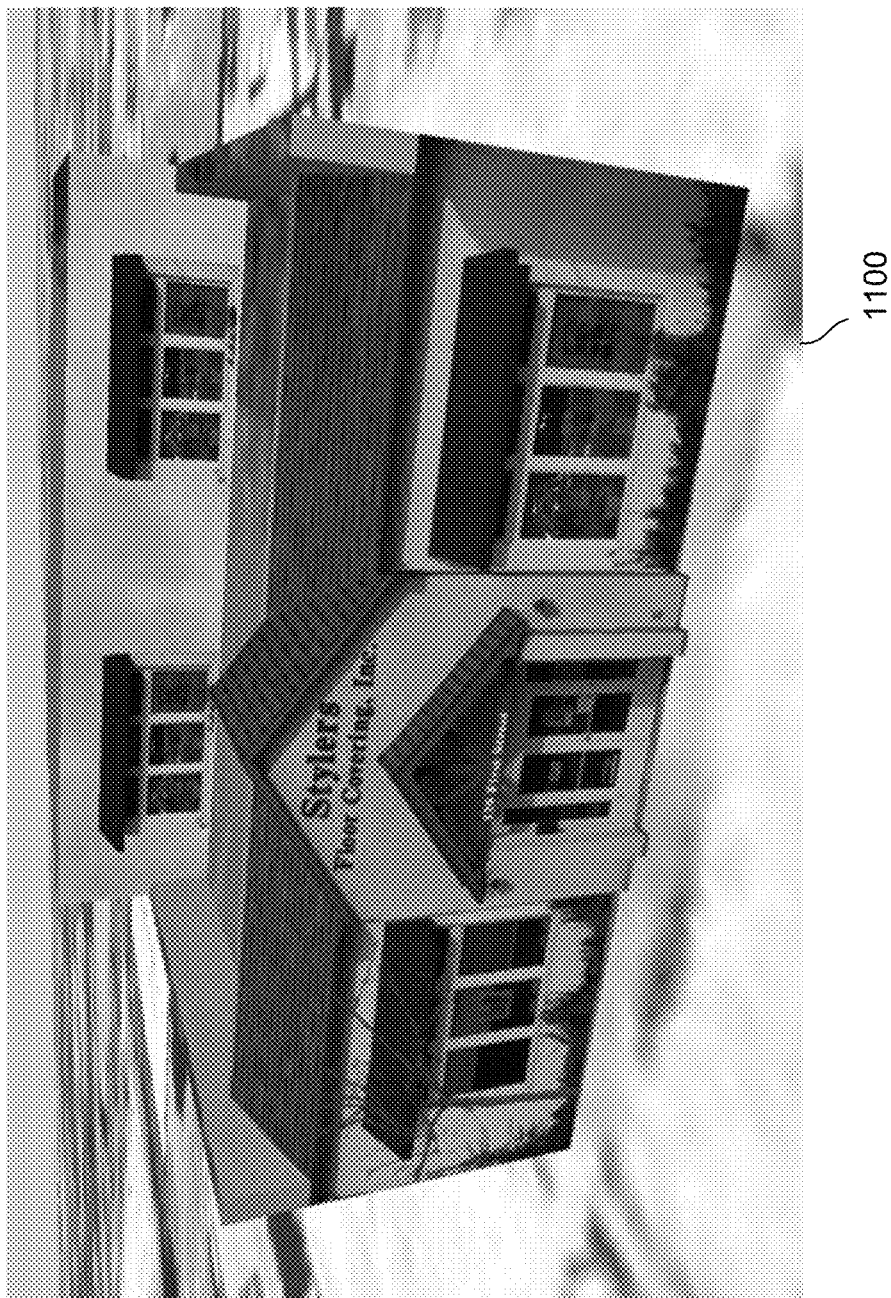
FIG. 11 illustrates a textured 3D building model in accordance with the present disclosure.

Referring to FIG. 10, textured façade 1001 is provided with a defined planar surface established by at least selected vertices 1002, 1003, 1004 and 1005 (e.g., four corners of the front of the building). Orthogonal image 1006 of the corresponding building object (looking down on the top of the building) is retrieved and the vertices/edges of the front edge of the building in the orthogonal image are identified and correlated to selected vertices 1002 through 1005 of the textured front façade 1001 (from FIG. 9). Vertex 1007 is selected to correlate to selected vertices 1004 and 1005 and vertex 1008 is selected to correlate to selected vertices 1002 and 1003. Identifying these vertices as being part of the same planar surface correlates the two images with the textured façade then incorporating the scale of the correlated ortho image. Once, the front facade of the building object has been correlated, the selection of the other vertices (e.g., 1009 and 1010) in the ortho image establishes the remaining perimeter of the building object (depth and width from ortho and height from the facade) which is then used to create the 3D building model as shown in FIG. 11 (with at least one side textured). The process (i.e., ground-level images-to-textured façade) can then be repeated to texture the sides or back of the established 3D model. Also, as new ground-level images become available, the facades can be retextured and thus updated using the façade texturing process of the technology described herein. In one embodiment, orthogonal image 1006 is retrieved from image database 104 of FIG. 1.

The correlation of 3D building model 1001 with orthogonal image 1006 provides a more accurate scale as well as providing a precise location according to the world coordinate system of 3D building model 1001.

In an alternative embodiment, the scaling of the 3D model is performed by correlation with known industry standard architectural features. For example, the distance from the front door sill to doorknob center is typically the same from building to building (e.g., 36 inches). Other known features include, but are not limited to, siding width, brick sizes, door and or window sizes. In another embodiment, known ratios of architectural features are used to scale the 3D model. For example, the height-to-width ratios for various door and window sizes are known. First, it is determined that known architectural features exist within one or more facades. Second, the known real-world sizing/ratios are correlated with the same features within the model. Scaling adjustments are made with a scaling factor (e.g., 1.03 percent scaling factor). The 3D model can then be scaled (sized) using the scaling factor.

FIG. 11 illustrates a textured 3D building model in accordance with the present disclosure. 3D building model 1100 is provided with accurate scaling, rotation and location information for ground-level façade textured geometry. 3D building model 1100 is reconstructed based on the gathered/existing information such as building geometry, façade geometry (textured), scale and geo-position. A reconstructed textured 3D building model is provided with current and accurate details.

Figure 12:
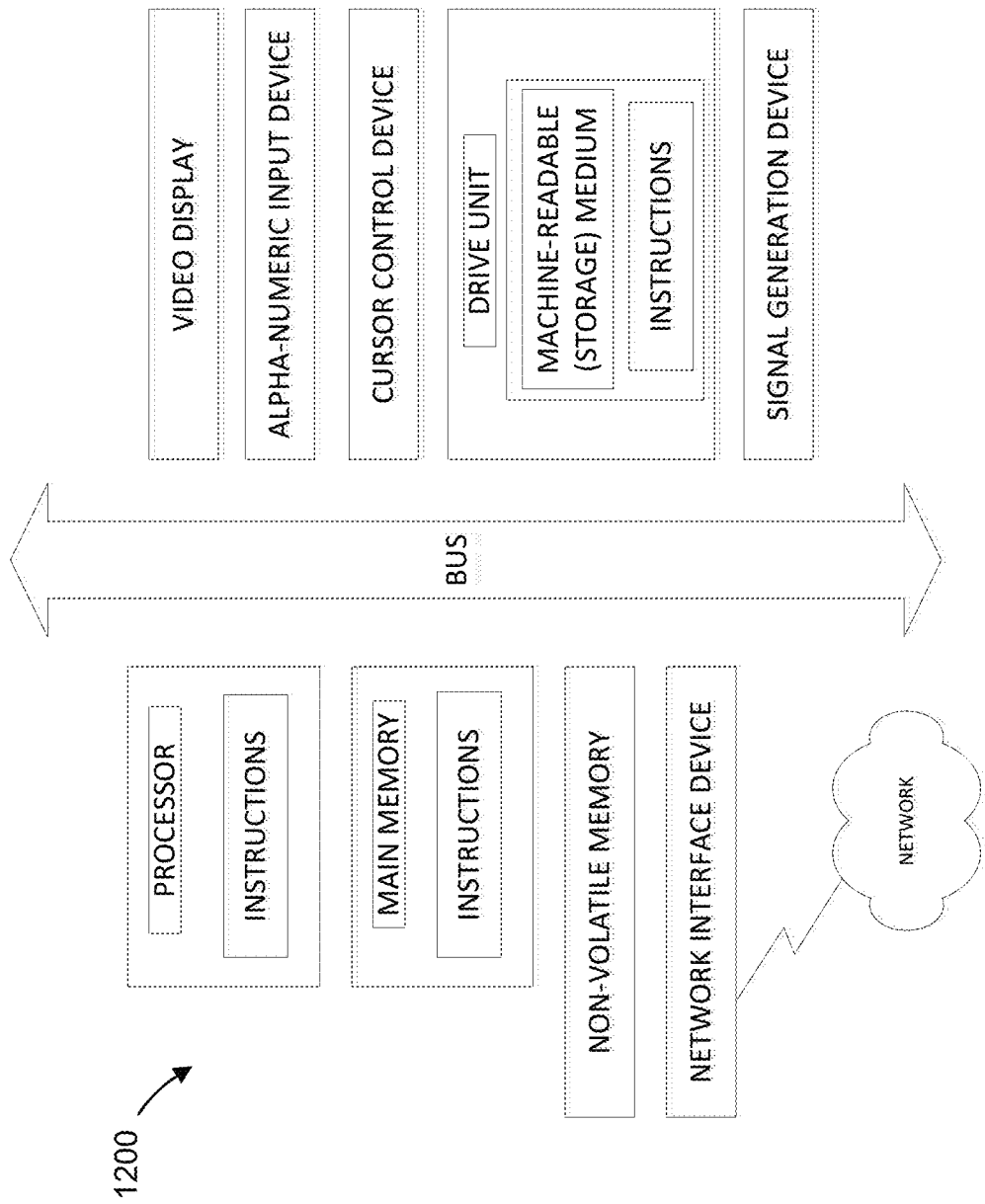
FIG. 12 illustrates a diagrammatic representation of a machine in the example form of a computer system in accordance with the present disclosure.

Referring now to FIG. 12, therein is shown a diagrammatic representation of a machine in the example form of a computer system 1200 within which a set of instructions, for causing the machine to perform any one or more of the methodologies or modules discussed herein, may be executed. Computer system 1200 includes a processor, memory, non-volatile memory, and an interface device. Various common components (e.g., cache memory) are omitted for illustrative simplicity. The computer system 1200 is intended to illustrate a hardware device on which any of the components depicted in the example of FIG. 1 (and any other components described in this specification) can be implemented. The computer system 1200 can be of any applicable known or convenient type. The components of the computer system 1200 can be coupled together via a bus or through some other known or convenient device.

This disclosure contemplates the computer system 1200 taking any suitable physical form. As example and not by way of limitation, computer system 1200 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, or a combination of two or more of these. Where appropriate, computer system 1200 may include one or more computer systems 1200; be unitary or distributed; span multiple locations; span multiple machines; or reside in a cloud, which may include one or more cloud components in one or more networks. Where appropriate, one or more computer systems 1200 may perform without substantial spatial or temporal limitation one or more steps of one or more methods described or illustrated herein. As an example and not by way of limitation, one or more computer systems 1200 may perform in real time or in batch mode one or more steps of one or more methods described or illustrated herein. One or more computer systems 1200 may perform at different times or at different locations one or more steps of one or more methods described or illustrated herein, where appropriate.

The processor may be, for example, a conventional microprocessor such as an Intel Pentium microprocessor or Motorola power PC microprocessor. One of skill in the relevant art will recognize that the terms "machine-readable (storage) medium" or "computer-readable (storage) medium" include any type of device that is accessible by the processor.

The memory is coupled to the processor by, for example, a bus. The memory can include, by way of example but not limitation, random access memory (RAM), such as dynamic RAM (DRAM) and static RAM (SRAM). The memory can be local, remote, or distributed.

The bus also couples the processor to the non-volatile memory and drive unit. The non-volatile memory is often a magnetic floppy or hard disk, a magnetic-optical disk, an optical disk, a read-only memory (ROM), such as a CD-ROM, EPROM, or EEPROM, a magnetic or optical card, or another form of storage for large amounts of data. Some of this data is often written, by a direct memory access process, into memory during execution of software in the computer 1200. The non-volatile storage can be local, remote, or distributed. The non-volatile memory is optional because systems can be created with all applicable data available in memory. A typical computer system will usually include at least a processor, memory, and a device (e.g., a bus) coupling the memory to the processor.

Software is typically stored in the non-volatile memory and/or the drive unit. Indeed, for large programs, it may not even be possible to store the entire program in the memory. Nevertheless, it should be understood that for software to run, if necessary, it is moved to a computer readable location appropriate for processing, and for illustrative purposes, that location is referred to as the memory in this paper. Even when software is moved to the memory for execution, the processor will typically make use of hardware registers to store values associated with the software, and local cache that, ideally, serves to speed up execution. As used herein, a software program is assumed to be stored at any known or convenient location (from non-volatile storage to hardware registers) when the software program is referred to as "implemented in a computer-readable medium." A processor is considered to be "configured to execute a program" when at least one value associated with the program is stored in a register readable by the processor.

The bus also couples the processor to the network interface device. The interface can include one or more of a modem or network interface. It will be appreciated that a modem or network interface can be considered to be part of the computer system 1200. The interface can include an analog modem, isdn modem, cable modem, token ring interface, satellite transmission interface (e.g., "direct PC"), or other interfaces for coupling a computer system to other computer systems. The interface can include one or more input and/or output devices. The I/O devices can include, by way of example but not limitation, a keyboard, a mouse or other pointing device, disk drives, printers, a scanner, and other input and/or output devices, including a display device. The display device can include, by way of example but not limitation, a cathode ray tube (CRT), liquid crystal display (LCD), or some other applicable known or convenient display device. For simplicity, it is assumed that controllers of any devices not depicted reside in the interface.

In operation, the computer system 1200 can be controlled by operating system software that includes a file management system, such as a disk operating system. One example of operating system software with associated file management system software is the family of operating systems known as Windows® from Microsoft Corporation of Redmond, Wash., and their associated file management systems. Another example of operating system software with its associated file management system software is the Linux™ operating system and its associated file management system. The file management system is typically stored in the non-volatile memory and/or drive unit and causes the processor to execute the various acts required by the operating system to input and output data and to store data in the memory, including storing files on the non-volatile memory and/or drive unit.

The technology as described herein may have also been described, at least in part, in terms of one or more embodiments. An embodiment of the technology as described herein is used herein to illustrate an aspect thereof, a feature thereof, a concept thereof, and/or an example thereof. A physical embodiment of an apparatus, an article of manufacture, a machine, and/or of a process that embodies the technology described herein may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While particular combinations of various functions and features of the technology as described herein have been expressly described herein, other combinations of these features and functions are likewise possible. For example, the steps may be completed in varied sequences to complete the textured facades. The technology as described herein is not limited by the particular examples disclosed herein and expressly incorporates these other combinations.

What is claimed:

1. One or more non-transitory computer readable medium storing instructions that, when executed, cause a processor to execute operations comprising:
   receiving a three dimensional (3D) point cloud of data points associated with a building object;
   identifying a plurality of vertices defining edges of at least one single planar surface of the building object within the 3D point cloud;
   outlining the at least one single planar surface based on the identified plurality of vertices;
   creating a simplified façade geometry for the at least one single planar surface based on the outlined single planar surface;
   correlating data points within the 3D point cloud to the outlined single planar surface;

averaging a planar fit for the outlined single planar surface based on the correlated data points; and adjusting a position of the simplified façade geometry based on the average planar fit.

2. The one or more non-transitory computer readable medium of claim 1 further storing instructions that, when executed, cause the processor to execute operations comprising receiving an orthogonal image for the building object.

3. The one or more non-transitory computer readable medium of claim 2 further storing instructions that, when executed, cause the processor to execute operations comprising:

identifying a plurality of orthogonal vertices of the orthogonal image;

correlating at least two of the plurality of orthogonal vertices with the adjusted simplified façade geometry; and constructing a building model representing all surfaces of the building object using at least the correlated plurality of orthogonal vertices.

4. The one or more non-transitory computer readable medium of claim 1 further storing instructions that, when executed, cause the processor to execute operations comprising applying a texture to the at least one planar surface.

5. The one or more non-transitory computer readable medium of claim 4, wherein the applying a texture comprises mapping at least one ground-level image to the at least one planar surface.

6. The one or more non-transitory computer readable medium of claim 1 further storing instructions that, when executed, cause the processor to execute operations comprising applying a proximity buffer to identify data points proximate one another for correlation to determine an average planar fit.

7. The one or more non-transitory computer readable medium of claim 1, wherein identifying the plurality of vertices defining edges comprises matching boundaries of the building object from at least one ground-level image.

* * * * *